(12) United States Patent
Kang et al.

(10) Patent No.: US 8,778,742 B1
(45) Date of Patent: Jul. 15, 2014

(54) METHODS AND SYSTEMS FOR GATE DIMENSION CONTROL IN MULTI-GATE STRUCTURES FOR SEMICONDUCTOR DEVICES

(71) Applicants: Sung-Taeg Kang, Austin, TX (US); ShanShan Du, Singapore (SG)

(72) Inventors: Sung-Taeg Kang, Austin, TX (US); ShanShan Du, Singapore (SG)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/871,411

(22) Filed: Apr. 26, 2013

(51) Int. Cl.
*H01L 21/82* (2006.01)
(52) U.S. Cl.
USPC ............ 438/128; 438/267; 257/390; 257/326
(58) Field of Classification Search
CPC .............................................. H01L 21/823456
USPC ........................... 438/128, 267; 257/390, 326
See application file for complete search history.

(56) References Cited

U.S. PATENT DOCUMENTS

| 6,525,369 | B1 | 2/2003 | Wu | |
| 6,690,192 | B1 * | 2/2004 | Wing | ............................... 326/32 |
| 6,897,114 | B2 * | 5/2005 | Krueger et al. | ............... 438/259 |
| 7,524,719 | B2 | 4/2009 | Steimle et al. | |

OTHER PUBLICATIONS

Orshansky et al., "Intra-Field Gate CD Variability and Its Impact on Circuit Performance", IEEE, 4 pgs. (1999).

\* cited by examiner

*Primary Examiner* — Tu-Tu Ho
(74) *Attorney, Agent, or Firm* — Egan, Peterman & Enders LLP.

(57) ABSTRACT

Methods and systems are disclosed for gate dimension control in multi-gate structures for integrated circuit devices. Processing steps for formation of one or more subsequent gate structures are adjusted based upon dimensions determined for one or more previously formed gate structures. In this way, one or more features of the resulting multi-gate structures can be controlled with greater accuracy, and variations between a plurality of multi-gate structures can be reduced. Example multi-gate features and/or dimensions that can be controlled include overall gate length, overlap of gate structures, and/or any other desired features and/or dimensions of the multi-gate structures. Example multi-gate structures include multi-gate NVM (non-volatile memory) cells for NVM systems, such as for example, split-gate NVM cells having select gates (SGs) and control gates (CGs).

14 Claims, 5 Drawing Sheets

1

METHODS AND SYSTEMS FOR GATE DIMENSION CONTROL IN MULTI-GATE STRUCTURES FOR SEMICONDUCTOR DEVICES

TECHNICAL FIELD

This technical field relates to the formation of multi-gate structures in semiconductor devices and, more particularly, to controlling dimensions for such multi-gate structures.

BACKGROUND

Prior programmable memories, as well as other integrated circuit devices, have utilized multi-gate structures. For example, a split-gate non-volatile memory (NVM) cell includes a select gate (SG) and a control gate (CG) that are used to add and remove charge from a charge storage layer. These select gates (SGs) and control gates (CGs) are typically formed in different processing steps during the fabrication process for NVM systems including split-gate NVM cells. Other multi-gate NVM cells have also been used for NVM systems. For example, triple-gate and other dual-gate NVM cell structures have been utilized for NVM systems. Further, multi-gate structures have been utilized in other integrated devices that are not NVM systems.

Reliability failure and/or undesirable performance variations can occur due to process variations and/or process tolerances for the semiconductor processing that is used to fabricate multi-gate structures. For example, program speed for different split-gate NVM cells within an NVM cell array can vary due to differences in the relative sizes and dimensions of select gates (SGs) and control gates (CGs) for split-gate NVM cells. These speed variations can cause performance problems with the operation of the NVM system including the split-gate NVM cell array. Similarly, differences between multi-gate structures within other integrated circuits, such as differences between other types of multi-gate NVM cells within NVM systems, can cause performance variations that lead to performance degradation.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale

DETAILED DESCRIPTION

Figure 1:
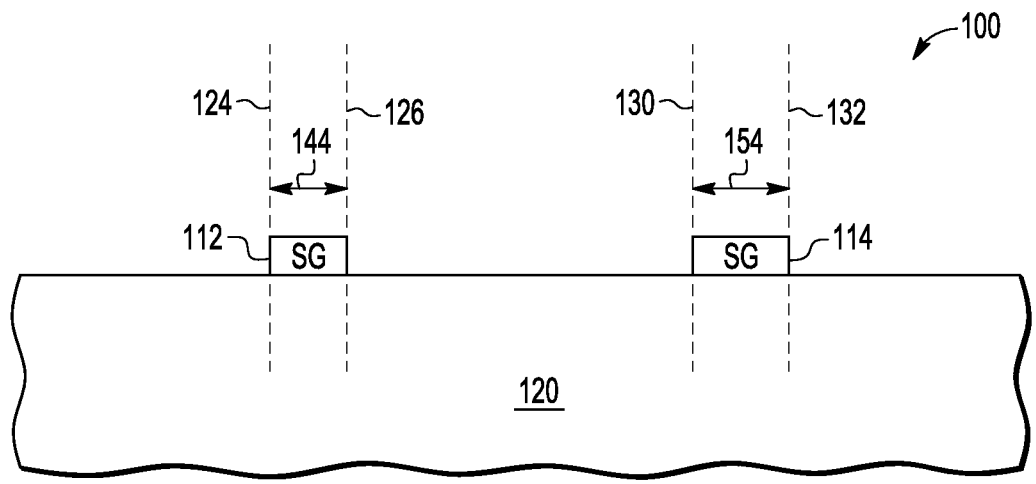
FIG. 1 is a cross-section diagram of an example embodiment for multi-gate structures for split-gate cells after formation of select gates.

Methods and systems are disclosed for gate dimension control in multi-gate structures for integrated circuit devices. The disclosed embodiments adjust processing steps for formation of one or more subsequent gate structures based upon dimensions determined for one or more previously formed gate structures. In this way, one or more features of the resulting multi-gate structures can be controlled with greater accuracy, and variations between a plurality of multi-gate structures can be reduced. Example multi-gate features and/or dimensions that can be controlled include overall gate length, overlap of gates, and/or any other desired features and/or dimensions of the multi-gate structures. Example multi-gate structures include multi-gate NVM (non-volatile memory) cells for NVM systems, such as for example, split-gate NVM cells having select gates (SGs) and control gates (CGs). Different features and variations can be implemented, as desired, and related or modified systems and methods can be utilized, as well.

As described herein, the disclosed embodiments can be utilized for multi-gate structures, including multi-gate non-volatile memory (NVM) cells. For example, the disclosed embodiments can be utilized with split-gate NVM cells to provide increased control of gate features across multiple split-gate NVM cells within a split-gate NVM cell array. For split-gate NVM cells, it has been determined that variations in the lengths for the select gates (SGs) and control gates (CGs) can adversely affect performance of the overall NVM system. For example, if the select gate (SG) and/or the control gate (CG) is relatively long for a particular split-gate NVM cell, program speed will be slower for that NVM cell as compared to other NVM cells within the NVM cell array potentially leading to yield loss due to program failure. If the select gate (SG) and/or the control gate (CG) is relatively short for a particularly split-gate NVM, the split-gate NVM cell can fail due to lack of overlap with the control gate (CG) potentially leading to breakdown failure during erase stress operations. Further, if the control gate (CG) is relatively short for a particularly split-gate NVM, the split-gate NVM cell can fail due to overshooting of cell program operations thereby leading to yield loss due to erase and/or disturb failures. Other failures and/or device performance degradation could also occur due to variations in gate dimensions within split-gate NVM cells. Further, other multi-gate structures, including other multi-gate NVM cells, can suffer failures and/or device performance degradation due to gate dimension variations.

To maintain consistent performance, therefore, the disclosed embodiments adjust processing steps for formation of one or more subsequent gate structures based upon measured dimensions of one or more previously formed gate structures. These adjustments to subsequent gate structures based upon previously formed gate structures allows for greater accuracy and control of multi-gate dimensions, such as overall gate length, gate overlap, and/or any other desired multi-gate dimension or feature. Further, different adjustments can be made for different individual multi-gate structures within an array of multi-gate structures so as to limit variations across the different multi-gate structures for a single semiconductor device. As such, performance across the multi-gate structures can be made more consistent thereby reducing failures and enhancing performance for the semiconductor device. For example, if a first gate formed for a particular multi-gate structure is relatively long, a second gate for this multi-gate structure can be formed such that it is relatively shorter in order to compensate for the long first gate. Similarly, if the first gate formed for a particular multi-gate structure is relatively short, the second gate can be formed such that it is relatively long in order to compensate for the short first gate. Other adjustments can also be made, as desired, to compensate for previously formed gate structures and to achieve desired features and/or dimensions within resulting multi-gate structures.

Figure 2:
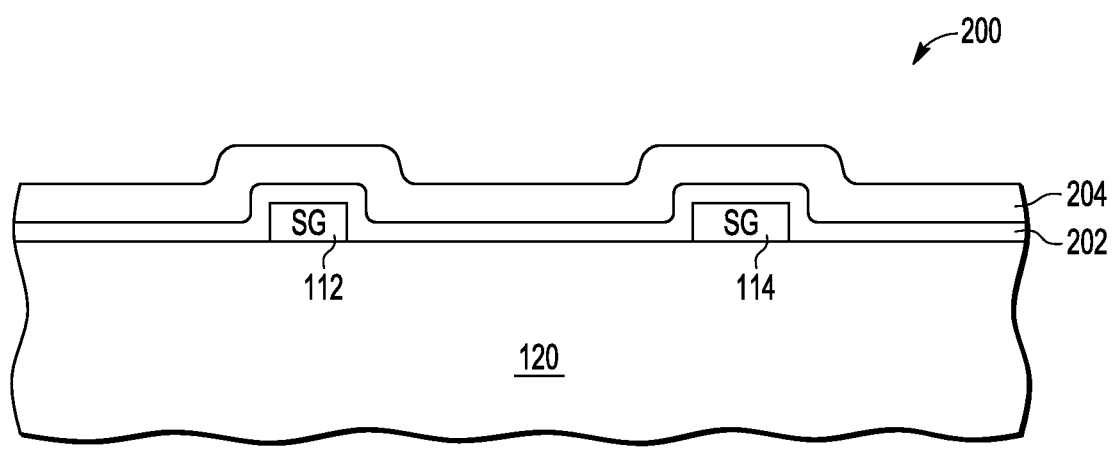
FIG. 2 is a cross-section diagram of an example embodiment for multi-gate structures for split-gate NVM (non-volatile memory) cells after formation of a charge storage layer and a control gate layer.
Figure 3:
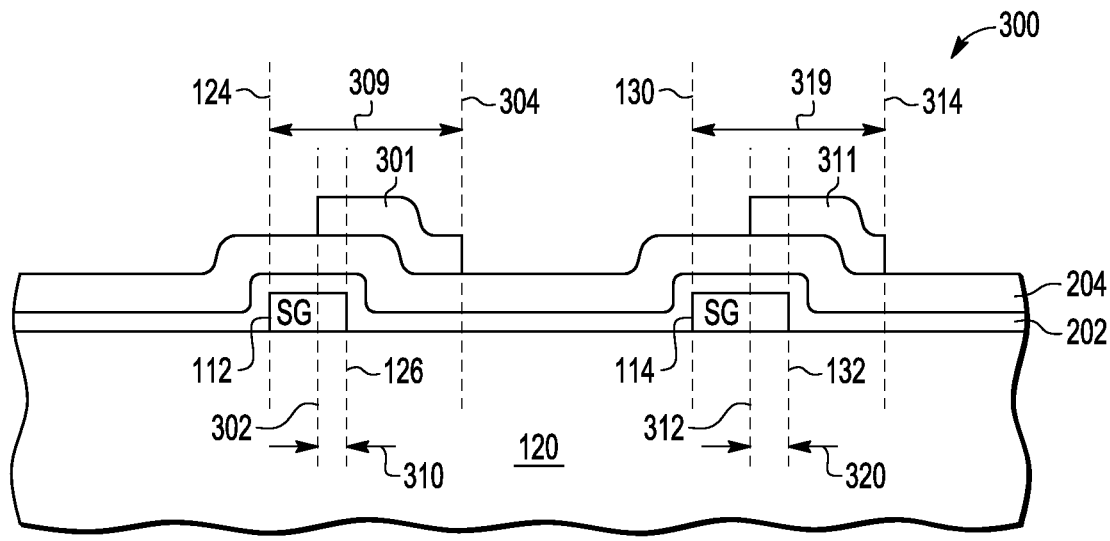
FIG. 3 is a cross-section diagram of an example embodiment for multi-gate structures for split-gate NVM cells after formation and patterning of photoresist layers.
Figure 4:
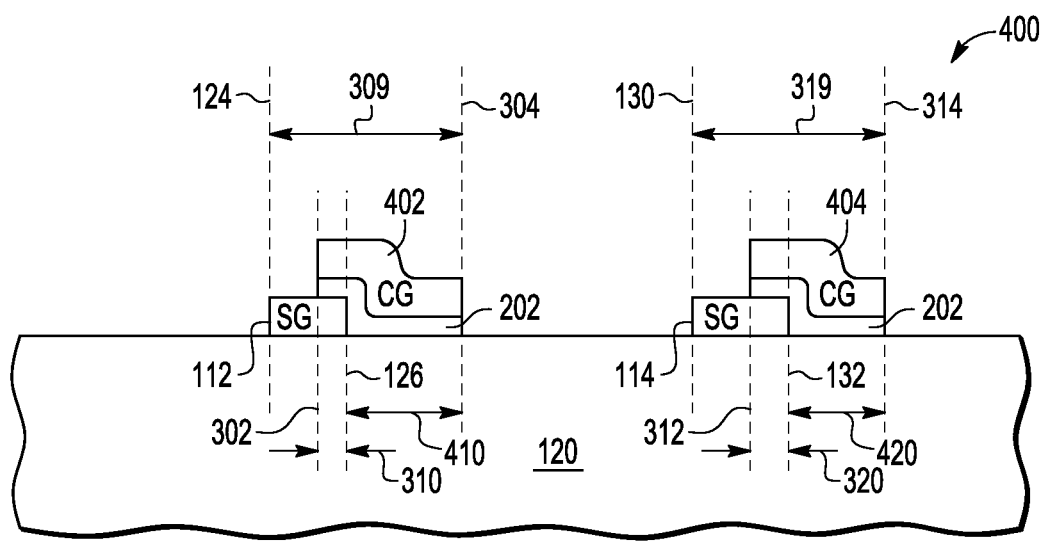
FIG. 4 is a cross-section diagram of an example embodiment for multi-gate structures for split-gate NVM cells after the photoresist layers have been used to form control gates.
Figure 5:
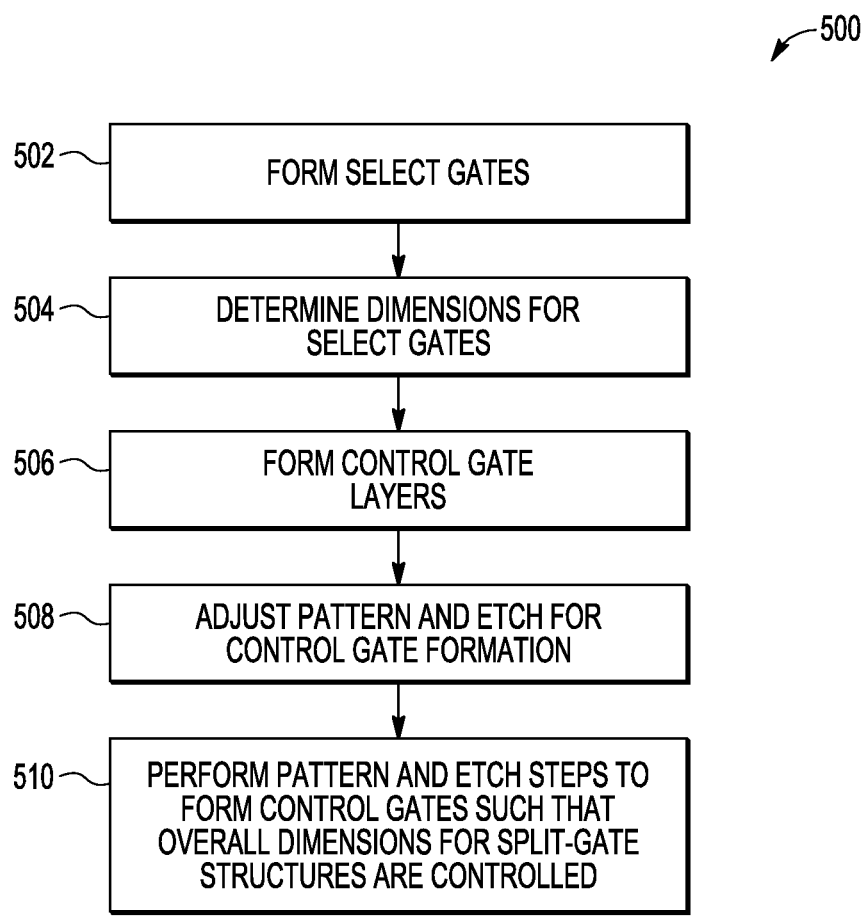
FIG. 5 is a flow diagram of an embodiment for controlling overall gate dimensions for split-gate NVM cells.
Figure 6:
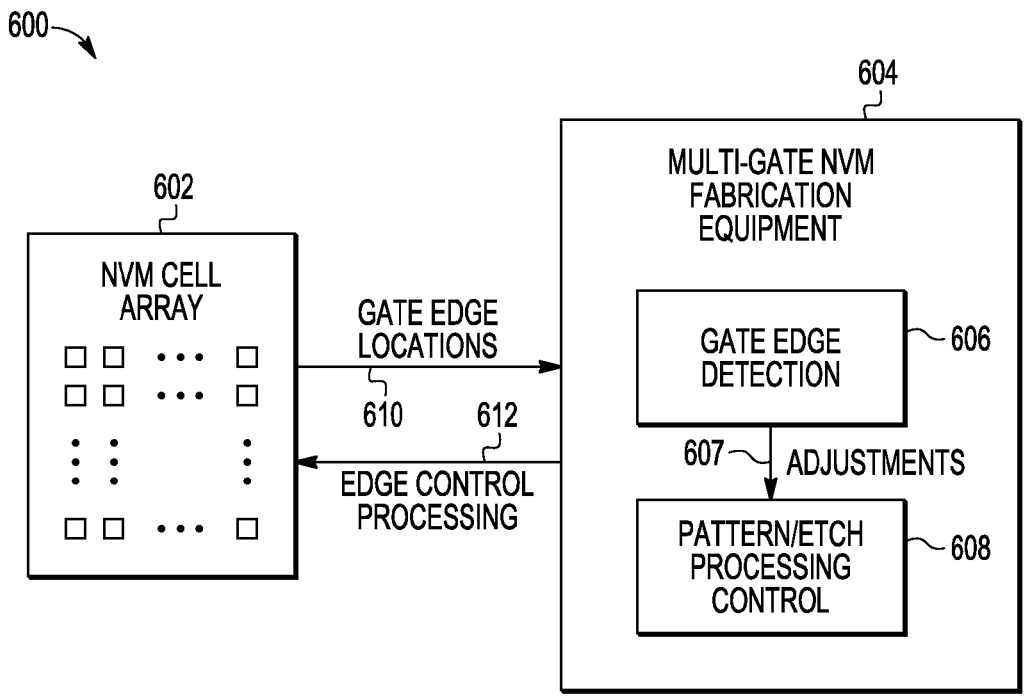
FIG. 6 is a block diagram of an embodiment for a processing system for fabrication of a multi-gate NVM cell array.
Figure 7:
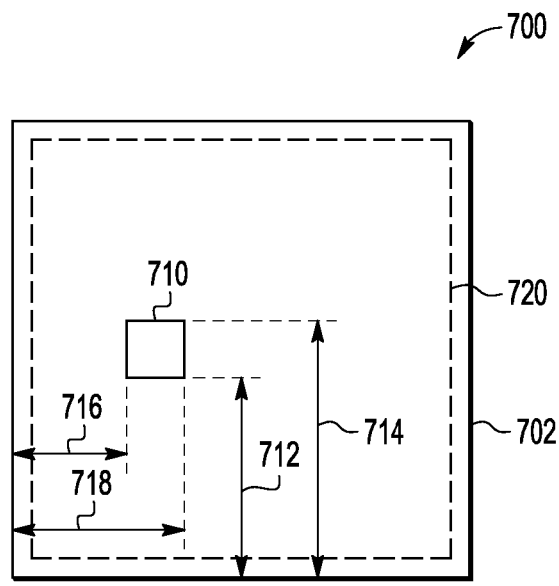
FIG. 7 is a top view diagram of an embodiment for using an overlay key to make gate structure measurements during fabrication of integrated circuits.
Figure 8:
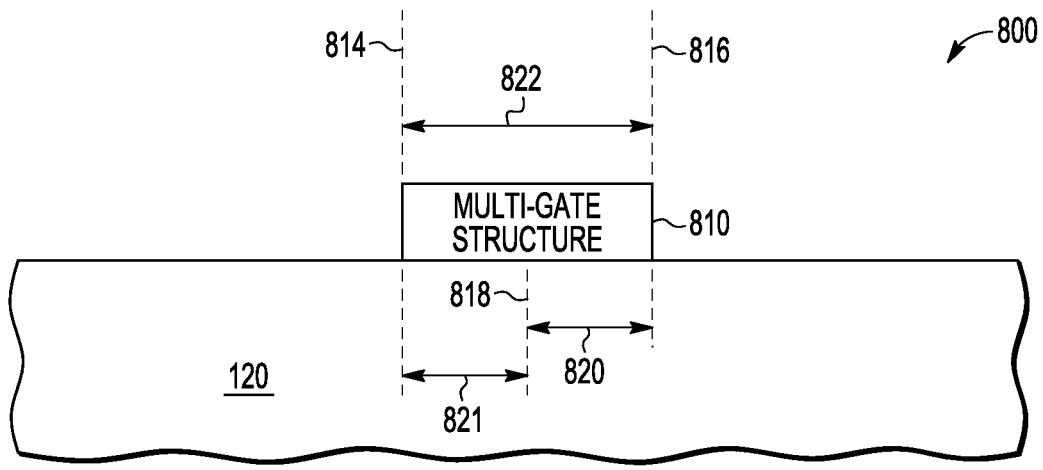
FIG. 8 is a cross-section of an example embodiment for a multi-gate structure that has been formed using gate dimensions determined for intervening gate processing steps.
Figure 9:
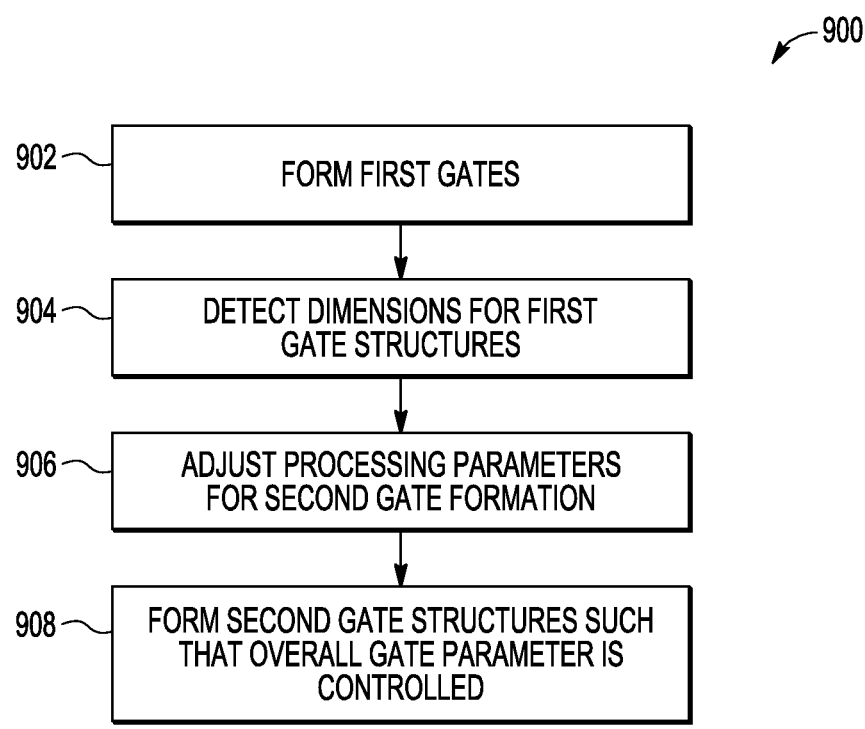
FIG. 9 is a flow diagram of an embodiment for controlling subsequent gate dimensions based upon detection of dimensions for previously formed gate structures.

With respect to the drawings, example embodiments are first described for split-gate NVM cells with respect to FIGS. 1-4. For these embodiments, select-gates (SG) are formed first, and dimensions related to the select gates (SGs) are detected. However, it is noted that control gates (CGs) could be formed first, if desired. The select-gate dimensions are then used to adjust processing steps for formation of the control gates (CGs) in order to control dimensions for the resulting split-gate NVM cells (e.g., overall gate length and gate overlap). As shown in FIG. 4, even though the select gates (SGs) and control gates (CGs) are different lengths, overall split-gate features and dimensions are controlled to be more consistent (e.g., overall gate length and gate overlap). FIG. 5 provides an example process flow diagram for formation of split-gate NVM cells utilizing the gate dimension determinations and processing adjustments described herein. FIG. 6 provides a block diagram for a processing system for forming an array of multi-gate NVM cells utilizing the techniques described herein. FIG. 7 provides a top view diagram of an embodiment for using an overlay key to make gate edge measurements during fabrication of integrated circuits. FIGS. 8-9 provide more general example embodiments for multi-gate structures formed for semiconductor devices. Other variations could also be implemented, as desired, while still utilizing the techniques described here.

FIG. 1 is a cross-section diagram of an example embodiment 100 for multi-gate structures for split-gate NVM cells after formation of select gates (SGs) 112 and 114 on a semiconductor substrate 120. The select gate (SG) 112 will be used for a first split-gate cell, and the select gate (SG) 114 will be used for a second split-gate cell. It is noted that the select gates (SGs) 112 and 114 can be any desired conductive material, such as for example doped polysilicon, metal, or another desired conductive material. It is also noted that for an array of select-gate cells within an NVM system, additional select gates will be formed.

As described herein, after formation of a gate for a multi-gate structure, the resulting dimensions of the gate are measured and utilized for adjustments to later gate formation steps for the multi-gate structures. As depicted in FIG. 1, a measurement between a first edge 124 and a second edge 126 for the select gate (SG) 112 can be made to determine the post-formation length 144 for select gate (SG) 112. Similarly, a measurement between a first edge 130 and a second edge 132 for the select gate (SG) 114 can be made to determine the post-formation length 154 for select gate (SG) 114. It is noted that one measurements technique is described below with respect to FIG. 7; however, other measurement techniques could be utilized, as desired.

As depicted, the post-formation length 144 for select gate (SG) 112 is smaller than the post-formation length 154 for select gate (SG) 114. While semiconductor manufacturing processes can control the variations in fabricated lengths, these manufacturing processes will have tolerances that lead to differences in post-fabrication lengths. These differences can lead to performance degradation. As described herein, gate dimension determinations made for the first gate formed for the multi-gate structure, such as the select gates (SGs) 112 and 114 for embodiment 100, are utilized to adjust the formation of later gate structures for the multi-gate structure, such as control gates (CGs) 402 and 404 as described below. In this way, the overall gate length for the multi-gate structure and/or the relationship between gates, such as gate overlap, can be controlled with greater accuracy.

FIGS. 2-4 provide an example embodiments for the formation of control gates associated with the select gates (SGs) 112 and 114 in embodiment 100 for split-gate NVM cells. The formation of these control gates are adjusted based upon the post-formation dimension measurements made for the select gates (SGs) 112 and 114. As such, the overall gate length can be controlled with greater accuracy. Further, for the split-gate NVM cell example of a multi-gate structure, the overlap of the control gate (CG) over the select gate (SG) can also be controlled with greater accuracy. Other features and/or dimensions could also be controlled, if desired.

FIG. 2 is a cross-section diagram of an example embodiment 200 for multi-gate structures for split-gate NVM cells after formation of charge storage layer 202 and control gate layer 204. It is noted that the control gate layer 204 can be any desired conductive layer. For example, control gate layer 204 can be formed as a doped polysilicon layer, as a metal layer, or as another desired conductive layer. Further, a combination of conductive layers could also be utilized for the control gate layer, if desired. It is also noted that the charge storage layer 202 can be any desired charge storage layer. For example, the charge storage layer 202 can be formed, for example, using silicon nanocrystals, metal nanoclusters, nitride or some other desired discrete charge storage material. It is further noted that the charge storage layer can also be a continuous charge storage layer, if desired, such as a floating gate charge storage layer formed using polysilicon layers, oxide-nitride-oxide layers, or layers of other desired materials. Other charge storage layers could also be used for, if desired.

FIG. 3 is a cross-section diagram of an example embodiment 300 for multi-gate structures for split-gate cells after formation and patterning of photoresist layers 301 and 311. For the embodiment 300 depicted, a patterned photoresist layer 301 has been formed with respect to select gate (SG) 112, and a patterned photoresist layer 311 has been formed with respect to the select gate (SG) 114. Advantageously, the patterned photoresist layer 301 has been formed so as to control the overall length 309 for the resulting multi-gate structure including select gate (SG) 112, which is shown in FIG. 4. Similarly, the patterned photoresist layer 311 has been formed to control the overall length 319 for the resulting multi-gate structure including select gate (SG) 114, which is also shown in FIG. 4. Further, the patterned photoresist layers 301 and 311 have also been formed so as to control the amount of overlap 310 and overlap 320 for the resulting control gates (CGs) in the multi-gate structures shown in FIG. 4.

Looking in more detail to select gate (SG) 112 in FIG. 3, one edge 304 of the patterned photoresist layer 301 will determine the outside edge of the resulting control gate, which is control gate (CG) 402 shown in FIG. 4. The position for edge 304 is selected so that the overall length of the multi-gate structure from the outside edge 124 of the select gate (SG) 112 to the outside edge 304 of resulting control gate will be a desired overall length, as represented by length 309. A second edge 302 of the patterned photoresist layer 301 will determine the interior edge of the resulting control gate. The position for edge 302 is selected so that the overlap of the interior edge 302 for the control gate over the interior edge 126 of the select gate (SG) 112 will be a desired overall length, as represented by length 310.

Looking in more detail to select gate (SG) 114 in FIG. 3, one edge 314 of the patterned photoresist layer 311 will determine the outside edge of the resulting control gate, which is control gate (CG) 404 shown in FIG. 4. The edge 314 is selected so that the overall length of the multi-gate structure from the outside edge 130 of the select gate (SG) 114 to the outside edge of resulting control gate 314 will be a desired overall length, as represented by length 319. A second edge 312 of the patterned photoresist layer 311 will determine the interior edge of the resulting control gate. The edge 312 is selected so that the overlap of the interior edge 312 for the control gate over the interior edge 132 of the select gate (SG) 114 will be a desired overall length, as represented by length 320.

FIG. 4 is a cross-section diagram of an example embodiment 400 for multi-gate structures for split-gate NVM cells after the photoresist layers have been used to form control gates (CGs) 402 and 404. For example, one or more selective etch processing steps can be used to remove the conductive layer 204 and the charge storage layer 202 in areas that are not underneath the patterned photoresist layers 301 and 311 in FIG. 3. Once these etch processing steps are complete, the photoresist layers 301 and 311 can be removed, for example, through one or more photoresist etch processing steps. Once the photoresist layers 301 and 311 are removed, the control gates (CGs) 402 and 404 remain, along with underlying charge storage layers 202. As described herein, the overall gate lengths 309 and 319 and/or the overlap lengths 310 and 320 can be controlled with more accuracy.

It is noted that lengths 144 and 154 in FIG. 1 represent the select gate (SG) lengths for the two select gates (SGs) 112 and 114. Lengths 310 and 320 in FIGS. 3 and 4 represent the overlap amounts for the control gates (CGs) 402 and 404 over the select gates (SGs) 112 and 114. Lengths 410 and 420 in FIG. 4 represent control gate (CG) lengths for the two control gates (CGs) 402 and 404 excluding the overlap portion of the control gates. And lengths 309 and 319 in FIGS. 3 and 4 represent the overall gate lengths for the split-gate NVM cells when completed. It is also noted that other or different multi-gate features and/or dimensions could be controlled utilizing the techniques described herein, as desired.

The split-gate NVM cells shown with respect to FIGS. 1-4, which include select gates (SGs) and control gates (CGs), provide one example for multi-gate structures for which gate dimensions could be controlled using the techniques described herein. As an additional example, it is noted that the split-gate NVM cell embodiments described herein can be formed, if desired, using a semiconductor process having a device line size of about 50 nanometers (nm) or less. For such an embodiment, it is noted that the overall gate length for the select-gate (SG) and control gates (CG) within each split-gate NVM cell can be a nominal value of 300 nm with a controlled variation of less than ±20 nm and preferably with a controlled variation of less than ±10 nm. Further, for such an embodiment, it is noted that the overlap of the control gate (CG) over the select gate (SG) can be a nominal value of 50 nm with a controlled variation of less than ±10 nm and preferably with a controlled variation of less than ±5 nm. Other semiconductor processes and variations could also be utilized, as desired.

The TABLE below provides example gate dimension values for two split-gate NVM cells (CELL 1, CELL 2) that have different control gate (CG) and select gate (SG) lengths but that still have consistent overall gate length and CG/SG overlap values. It is noted that the dimension values for the TABLE below are provided in nanometers (nm). It is further noted that the dimension values are example dimension values, and other dimensions and/or multi-gate structures could be utilized as desired.

TABLE

EXAMPLE SPLIT-GATE DIMENSIONS

| NVM Cell | SG Length | CG Length | CG/SG Overlap | Overall Gate Length |
|---|---|---|---|---|
| CELL 1 | 125 nm | 181 nm | 52 nm | 306 nm |
| CELL 2 | 150 nm | 154 nm | 58 nm | 304 nm |

As can be seen in the TABLE above, even though the select gates (SGs) vary by 25 nm and the control gates (CGs) vary by 27 nm, the overall gate length of the split-gate cells vary by only 2 nm. Further, the overlap of the control gates (CGs) over the select gates (SGs) vary by only 6 nm. During processing of CELL 1, because CELL 1 had a relatively shorter select gate (SG) length of 125 nm, the control gate (CG) for CELL 1 was made a relatively longer length of 181 nm to achieve an overall length of about 300 nm within ±10 nm. Further, the interior edge of the control gate (CG) for CELL 2 was also adjusted so as to achieve a CG/SG overlap of about 50 nm within ±10 nm. During processing of CELL 2, because CELL 2 had a relatively longer select gate (SG) length of 150 nm, the control gate (CG) for CELL 2 was made a relatively shorter length of 154 nm to achieve a overall length of about 300 nm within ±10 nm. Further, the interior edge of the control gate (CG) for CELL 2 was also adjusted so as to achieve a CG/SG overlap of about 50 nm within ±10 nm. It is again noted that the TABLE above and the values provided are example dimensions, and other dimensions and/or other multi-gate structures could be utilized as desired.

FIG. 5 is a flow diagram of an embodiment 500 for controlling overall gate lengths for split-gate NVM cells. In block 502, select gates (SGs) are formed for the split-gate NVM cells that are being formed. In block 504, dimensions are determined for the select gates (SGs). In block 506, control gate layers are formed along with any underlying layers, such as charge storage layers. In block 508, pattern and etch processing parameters are adjusted for control gate formation based upon the dimensions determined for the select gates (SGs). In block 510, the pattern and etch processing steps are performed to form the control gates (CGs) such that overall dimensions for the split-gate NVM cells are controlled. As described herein, the overall controlled dimensions can include, for example, the overall gate length for the split-gate NVM cells and/or the overlap of the control gates (CGs) over the select gates (SGs). It is noted that control gates (CGs) could be formed first, if desired, and processing parameters for select gates (SGs) could then be adjusted based upon dimensions determined for the previously formed control gates (CGs). Other variations could also be implemented, as desired.

FIG. 6 is a block diagram of an embodiment 600 for a processing system for fabrication of a multi-gate NVM cell array 602. As depicted, multi-gate NVM fabrication equipment 604 includes gate edge detection circuitry 606 and pattern/etch processing control circuitry 608. The multi-gate NVM fabrication equipment 604 is utilized to form two or more gate structures for multi-gate structures for the NVM cells within the NVM cell array 602. When first gate structures are completed, gate edge locations 610 are determined using the gate edge detection circuitry 606. These gate edge locations 610 are analyzed and used to provide adjustments 607 for the processing parameters for the pattern/etch processing control circuitry 608. These adjusted processing parameters are then utilized to provide edge control processing 612 for formation of additional gate structures for the NVM cells within the NVM cell array 602. As described herein, multi-gate NVM cells for NVM cell arrays in NVM systems can include split-gate NVM cells, triple gate NVM cells, other dual gate NVM cells, and/or other desired multi-gate cell structures, as desired.

FIG. 7 is a top view diagram of an embodiment 700 for using an overlay key to make gate structures measurements during fabrication of integrated circuits. The dashed square 720 represents an area of a semiconductor substrate that is be used to fabricate an integrated circuit die. Typically, a large number of integrated circuit dies are formed on a single semiconductor substrate, such as a semiconductor wafer or another substrate upon which a semiconductor substrate material has been formed. The solid square 702 represent an overlay key that can be formed around the die 720 to facilitate measurements within the die during fabrication. For example, the overlay key 702 can be formed within scribe lines for the integrated circuit die 702. Scribe lines are portions of the semiconductor substrate that are cut to form individual dies after fabrication of a number of dies on the semiconductor substrate. Element 710 represents a gate structure fabricated on the die 720 for which gate structure measurements are desired to be made. For example, the one or more of the edges for overlay key 702 can be used to provide a reference for measurements made for structures associated with the gate structure 710. For example, as depicted, one edge of the overlay key 702 is used to make measurements 712 and 714 to the bottom and top edges of the gate structure 710, and a different edge of the overlay key 702 is used to make measurements 716 and 718 for the left and right edges of the gate structure 710. Different structures and/or measurements could also be made, and other measurement techniques could be used, as desired.

While split-gate NVM cells and other multi-gate NVM cells are described with respect to FIGS. 1-6 above, other multi-gate structures could also be formed utilizing the embodiments described herein. FIGS. 8-9 provide more general example embodiments for such multi-gate structures. The overlay key technique described with respect to FIG. 7 could be utilized for both the embodiments of FIGS. 1-6 and FIGS. 8-9. Other variations and techniques could also be implemented as desired.

FIG. 8 is a cross-section of an example embodiment 800 for a multi-gate structure 810 that has been formed using gate dimensions measured for intervening gate processing steps. As depicted, the multi-gate structure 810 has been formed on substrate 120 and can include one or more gate structures or edges. As described herein, one or more features of the multi-gate structure 810 can be controlled using dimension measurements. For example, the overall gate length 822 for the multi-gate structure 810 can be controlled by adjusting a location of edge 814 based upon the post-formation location of edge 816, if edge 816 is formed first. Similarly, the overall gate length 822 for the multi-gate structure 810 can be controlled by adjusting a location of edge 816 based upon the post-formation location of edge 814, if edge 814 is formed first. Further, a length 820 and/or a length 821 associated with an internal gate structure or edge for the multi-gate structure 810, as represented by dashed line 818, can be controlled by adjusting edge locations based upon post-formation locations of one or more previously formed gate structures for the multi-gate structure 810. Other features, structures, and/or lengths associated with the multi-gate structure 810 could also be controlled, as desired, using the techniques described herein that adjust fabrication parameters for later formed gate structures based upon measurements associated with previously formed gate structures in a multi-gate structure.

FIG. 9 is a flow diagram of an embodiment 900 for controlling subsequent gate dimensions based upon detection of dimensions for previously formed gate structures. In block 902, first gates are formed for multi-gate structures. In block 904, dimensions are determined for the one or more first gate structures. In block 906, the processing parameters for formation of one or more second gate structures are adjusted based upon measurements made for the first gate structures. In block 908, the second gate structures are formed such that one or more gate parameters is controlled. As described herein, gate parameters for the resulting multi-gate structures that may be controlled include overall gate length, gate overlap, and/or other desired features or dimensions for the multi-gate structures. Further, it is noted that a single dimension or feature for the multi-gate structure can be controlled, or multiple dimensions or features for the multi-gate structures can be controlled, as desired.

As described herein, therefore, dimensions measured for one or more previously formed gates in a multi-gate structure are used to control subsequent processing steps for one or more additional gates in the multi-gate structure so that overall gate dimensions and/or features for multi-gate structures are controlled with more consistency. Thus, using the embodiments described herein, nominal values and tolerances for multi-gate features and/or dimensions can be controlled with greater accuracy. For example, the embodiments described herein can be utilized to achieve variations in one or more multi-gate feature or dimension (e.g., overall gate lengths of multi-gate structures) that vary by 10 percent or less across a plurality of multi-gate structures for a semiconductor device. In addition, this reduced variation can be achieved even though one or more of the features or dimensions (e.g., gate length of first gates within multi-gate structures) of the individual gate structures for the multi-gate structures have variations that vary by more than 10 percent across a plurality of multi-gate structures for a semiconductor device. Still further, in some embodiments, the number of multi-gate structures formed are one hundred or more multi-gate structures. Other variations could also be implemented as desired.

As described herein, a variety of embodiments can be implemented and different features and variations can be implemented, as desired.

In one embodiment, a method for making an integrated circuit device including a plurality of multi-gate structures includes forming first gates for a plurality of multi-gate structures for an integrated circuit device where each multi-gate structure is to have an overall gate length determined at least in part by a location for an outside edge of the first gate and by a location for an outside edge of a second gate for the multi-gate structure, determining a location for the outside edge of each of the first gates, adjusting processing parameters to adjust locations for the outside edges of the second gates based upon the outside edge locations of the first gates and based upon a desired overall gate length for the multi-gate structures, and forming the second gates using the adjusted processing parameters. In further embodiments, at least one hundred or more multi-gate structures are formed, and the overall gate lengths for the plurality of multi-gate structures vary by 10 percent or less. In still further embodiments, the gate lengths for the first gates vary by more than 10 percent.

In additional embodiments, the multi-gate structures can include multi-gate structures for multi-gate non-volatile memory (NVM) cells. Further, the multi-gate NVM cells can include split-gate NVM cells, and each of the multi-gate structures can include a select gate and a control gate. Still further, the desired overall gate length can include a combined gate length for the select gate and the control gate without including any gate overlap. In addition, the method can include forming a charge storage layer between the select gates and the control gates for the split-gate NVM cells. In further embodiments, the multi-gate structures can include one or more additional gates in addition to the first gates and the second gates.

In further embodiments, the first gates include the control gates for the split-gate NVM cells, and the second gates include select gates for the split-gate NVM cells. For other embodiments, the first gates include select gates for the split-gate NVM cells, and the second gates include control gates for the split-gate NVM cells. Still further, the determining step can further include determining a location for an inside edge of each of the select gates, and the adjusting step can further include adjusting processing parameters to adjust locations for inside edges of the control gates based upon the inside edge locations for the select gates and based upon a desired overlap length for the inside edges of the control gates over the inside edges of the select gates.

For still further embodiments, the adjusting step can include adjusting processing parameters for a photoresist layer, and the forming the second gates step includes forming a patterned photoresist layer using the adjusted processing parameters for the photoresist layer where the patterned photoresist layer is determining the locations for the outside edges of the second gates. In addition, the forming the second gates step can further include one or more etch processing steps. Still further, the determining step can include using an overlay key to determine the outside edge locations for the first gates.

In one other embodiment, an integrated circuit device having a plurality of multi-gate structures includes a plurality of first gates for a plurality of multi-gate structures for an integrated circuit device and a plurality of second gates for the plurality of multi-gate structures, where the plurality of multi-gate structures include at least one hundred or more multi-gate structures, and where overall gate lengths for the plurality of multi-gate structures vary by 10 percent or less. For additional embodiments, gate lengths for the first gates can vary by more than 10 percent.

In further embodiments, the multi-gate structures include multi-gate structures for multi-gate non-volatile memory (NVM) cells. In addition, the multi-gate NVM cells can be split-gate NVM cells, and each of the multi-gate structures can include a select gate and a control gate. Further, the overall gate lengths can be combined gate lengths for the select gates and the control gates without including any gate overlaps. Still further, the multi-gate structures can include one or more additional gates in addition to the first gates and the second gates.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A method for making an integrated circuit device including a plurality of multi-gate structures, comprising:
    forming first gates for a plurality of multi-gate structures for an integrated circuit device, each multi-gate structure to have an overall gate length determined at least in part by a location for an outside edge of the first gate and by a location for an outside edge of a second gate for the multi-gate structure;
    determining a location for the outside edge of each of the first gates;
    adjusting processing parameters to adjust locations for the outside edges of the second gates based upon the outside edge locations of the first gates and based upon a desired overall gate length for the multi-gate structures; and
    forming the second gates using the adjusted processing parameters.

2. The method of claim 1, wherein at least one hundred or more multi-gate structures are formed, and wherein the overall gate lengths for the plurality of multi-gate structures vary by 10 percent or less.

3. The method of claim 2, wherein gate lengths for the first gates vary by more than 10 percent.

4. The method of claim 1, wherein the multi-gate structures comprise multi-gate structures for multi-gate non-volatile memory (NVM) cells.

5. The method of claim 4, wherein the multi-gate NVM cells comprise split-gate NVM cells, and wherein each of the multi-gate structures comprises a select gate and a control gate.

6. The method of claim 5, wherein the desired overall gate length comprises a combined gate length for the select gate and the control gate without including any gate overlap.

7. The method of claim 5, wherein the first gates comprise the control gates for the split-gate NVM cells, and wherein the second gates comprise the select gates for the split-gate NVM cells.

8. The method of claim 5, wherein the first gates comprise select gates for the split-gate NVM cells, and wherein the second gates comprise control gates for the split-gate NVM cells.

9. The method of claim 8, wherein the determining step further comprises determining a location for an inside edge of each of the select gates, and wherein the adjusting step further comprises adjusting processing parameters to adjust locations for inside edges of the control gates based upon the inside edge locations for the select gates and based upon a desired overlap length for the inside edges of the control gates over the inside edges of the select gates.

10. The method of claim 5, further comprising forming a charge storage layer between the select gates and the control gates for the split-gate NVM cells.

11. The method of claim 1, wherein the adjusting step comprises adjusting processing parameters for a photoresist layer, and wherein the forming the second gates step comprises forming a patterned photoresist layer using the adjusted processing parameters for the photoresist layer, the patterned photoresist layer determining the locations for the outside edges of the second gates.

12. The method of claim 11, wherein the forming the second gates step further comprises one or more etch processing steps.

13. The method of claim 1, wherein the multi-gate structures comprise one or more additional gates in addition to the first gates and the second gates.

14. The method of claim 1, wherein the determining step comprises using an overlay key to determine the outside edge locations for the first gates.

* * * * *